(12) United States Patent
Maeda et al.

(10) Patent No.: US 9,313,911 B2
(45) Date of Patent: Apr. 12, 2016

(54) PACKAGE SUBSTRATE

(71) Applicant: Murata Manufacturing Co., Ltd., Nagaokakyo-shi, Kyoto-fu (JP)

(72) Inventors: Atsuyoshi Maeda, Otsu (JP); Shingo Ito, Kyoto (JP); Satoru Noda, Otsu (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 51 days.

(21) Appl. No.: 13/689,794

(22) Filed: Nov. 30, 2012

(65) Prior Publication Data
US 2013/0083502 A1 Apr. 4, 2013

Related U.S. Application Data

(63) Continuation of application No. 12/722,607, filed on Mar. 12, 2010, now Pat. No. 8,339,797.

(30) Foreign Application Priority Data

Mar. 12, 2009 (JP) .................................. 2009-059522

(51) Int. Cl.
| | |
|---|---|
| H05K 1/18 | (2006.01) |
| H05K 7/02 | (2006.01) |
| H01G 4/232 | (2006.01) |
| H01G 4/40 | (2006.01) |
| H01L 23/498 | (2006.01) |
| H01L 23/50 | (2006.01) |
| H01L 23/538 | (2006.01) |

(52) U.S. Cl.
CPC .............. *H05K 7/026* (2013.01); *H01G 4/232* (2013.01); *H01G 4/40* (2013.01); *H01L 23/49816* (2013.01); *H01L 23/50* (2013.01); *H01L 23/49838* (2013.01); *H01L 23/5389* (2013.01); *H01L 2224/16* (2013.01); *H01L 2924/01046* (2013.01); *H01L 2924/01078* (2013.01); *H01L 2924/01079* (2013.01); *H01L 2924/15311* (2013.01)

(58) Field of Classification Search
USPC .................... 361/760–784, 792–795, 803; 257/720–730
See application file for complete search history.

(56) References Cited

U.S. PATENT DOCUMENTS

| 5,798,567 A * | 8/1998 | Kelly et al. .................... 257/723 |
| 6,549,395 B1 * | 4/2003 | Naito et al. .................. 361/306.1 |
| 7,005,747 B2 * | 2/2006 | Koizumi ...................... 257/777 |

(Continued)

OTHER PUBLICATIONS

Maeda et al.; Package Substrate; U.S. Appl. No. 12/722,607, filed Mar. 12, 2010.

*Primary Examiner* — Tuan T Dinh
(74) *Attorney, Agent, or Firm* — Keating & Bennett, LLP

(57) ABSTRACT

A package substrate includes a main package body including a first principal surface on which an IC is mounted, and a second principal surface, opposed to the first principal surface, on which first bonding materials for mounting are provided. An internal circuit is provided within the main package body and connected to the first bonding materials. A sub-package is arranged on the second principal surface and includes electronic components embedded therein. A thickness direction dimension being the distance from the second principal surface to a portion of the sub-package most distant from the second principal surface, is not more than a thickness direction dimension being the distance from the second principal surface to an edge of the first bonding material at the second principal surface.

7 Claims, 18 Drawing Sheets

(56) References Cited

U.S. PATENT DOCUMENTS

| | | | |
|---|---|---|---|
| 7,215,531 B2 * | 5/2007 | Naito et al. | 361/306.1 |
| 7,687,905 B2 * | 3/2010 | Stone et al. | 257/724 |
| 2004/0027813 A1 * | 2/2004 | Li | H01L 23/49822 361/767 |
| 2005/0199929 A1 * | 9/2005 | Horikawa et al. | 257/296 |
| 2008/0192452 A1 * | 8/2008 | Randall et al. | 361/782 |

* cited by examiner

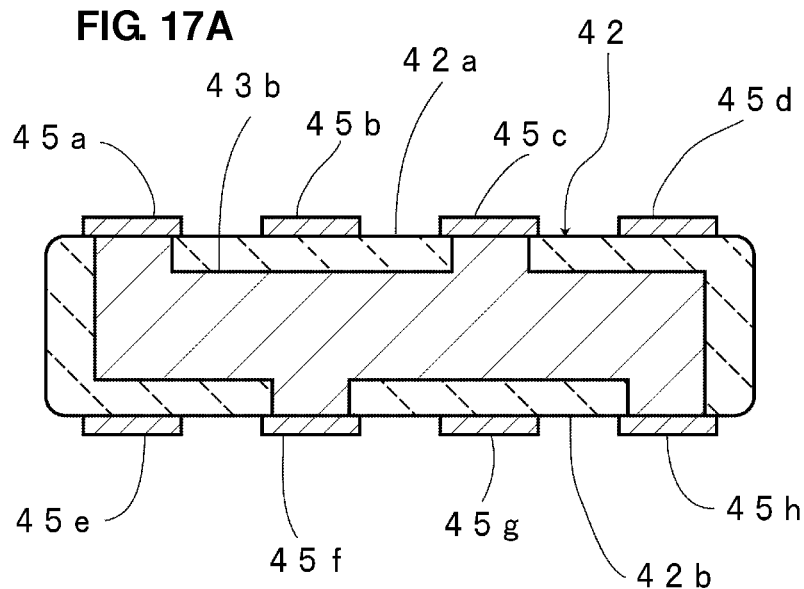
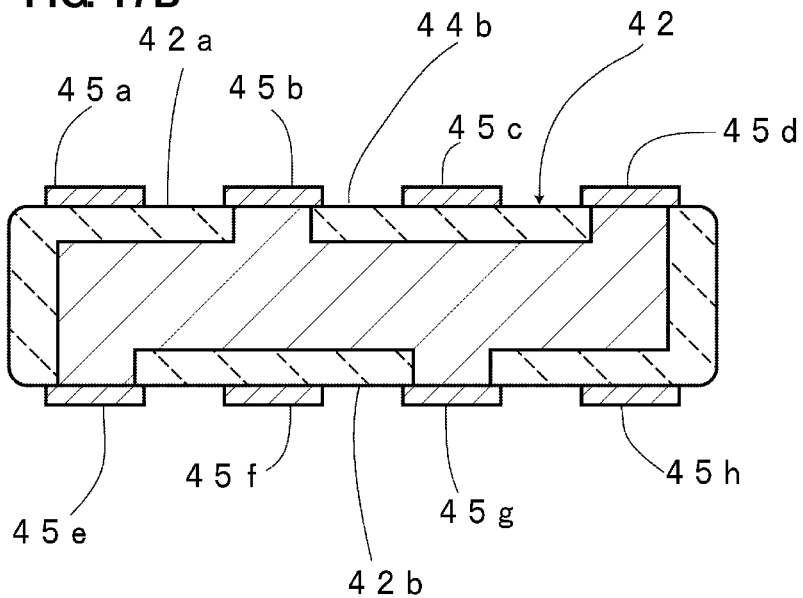

PACKAGE SUBSTRATE

BACKGROUND OF THE INVENTION

1. Field of the Invention

The present invention relates to a package substrate used for a package for an electronic component, and more particularly, to a package substrate having an internal circuit and a structure in which a plurality of independent electronic components electrically connected to the internal circuit are included.

2. Description of the Related Art

Recently, cellular phones and personal computers use MPUs having increased clock frequencies. Thus, noise having many harmonics is likely to be superimposed in power supply lines for the MPUs.

In order to prevent the above adverse effect caused by the noise, typically a decoupling capacitor is often connected between a power supply line and a ground. The decoupling capacitor is a necessary element of a power supply circuit because the decoupling capacitor also suppresses a transient phenomenon of a power supply system.

In the related art, the decoupling capacitor is often surface-mounted on a package substrate to which an MPU is die-bonded. For example, a plurality of decoupling capacitors is mounted on the package substrate so as to surround the MPU. In such a structure, it is difficult to reduce the size of the package substrate.

For this reason, Japanese Unexamined Patent Application Publication (Translation of PCT Application) No. 2004-527908 discloses a structure in which a capacitor 101 is embedded in a package substrate 102 as shown in FIG. 18. Here, the package substrate 102 includes layers of a synthetic resin, such as an epoxy resin, and conductive layers that are laminated by a build-up method, and includes a space 102a therein. The capacitor 101 defined by a multilayer capacitor is embedded in the space 102a. On the package substrate 102, a die 103 is bonded via bumps 104.

The capacitor 101 used a decoupling capacitor is embedded in the package substrate 102 disclosed in Japanese Unexamined Patent Application Publication (Translation of PCT Application) No. 2004-527908. Thus, the area of the package substrate 102 can be reduced.

However, various problems arise in a structure in which an electronic component, such as a capacitor, is embedded in a package substrate. For example, an undesirable gap often occurs between the embedded electronic component and the package substrate, causing a decrease in reliability.

Further, when the location of the embedded electronic component is deviated from a desired position, there is the possibility of causing a poor connection of the electronic component to a via-hole electrode, in the package substrate, to which electronic components should be connected.

SUMMARY OF THE INVENTION

To overcome the problems described above, preferred embodiments of the present invention provide a package substrate that does not require embedding an electronic component, such as a capacitor, within the substrate, can prevent a decrease in reliability including reliability of an electric connection, and can achieve a reduction in size, particularly, a reduction in thickness.

According to a preferred embodiment of the present invention, a package substrate includes a main package and a sub-package. The main package includes a main package body having first and second principal surfaces that are opposed to each other, a first bonding material provided on the second principal surface of the main package body, and an internal circuit provided within the main package body and electrically connected to the first bonding material. The sub-package is disposed on the second principal surface of the main package and includes a plurality of electronic components embedded therein. A thickness direction dimension that is a dimension from the second principal surface of the main package to a portion of the sub-package that is most distant from the second principal surface of the main package, is equal or substantially equal to or less than a thickness direction dimension of the first bonding material.

In a package substrate according to a preferred embodiment of the present invention, the main package body is provided without embedding an independent electronic component therein. Thus, the thickness of the main package body can be relatively small, and thus, the thickness of the package substrate can be reduced. In addition, because an independent electronic component is not embedded in the main package body, a decrease in reliability that is caused due to an undesirable gap between the main package body and the electronic component is unlikely to occur. Further, the reliability of an electric connection between the independent electronic component and an electrode in the main package body is significantly improved.

In a package substrate according to another preferred embodiment of the present invention, the sub-package includes a sub-package body having first and second principal surfaces that are opposed to each other, a first pad conductor provided on the first principal surface of the sub-package body and electrically connected to the internal circuit of the main package and the electronic components within the sub-package body, and a second pad conductor provided on the second principal surface of the sub-package body and electrically connected to the electronic components within the sub-package. The second pad conductor functions together with the first bonding material as an input path portion to the internal circuit or an output path portion from the internal circuit. In this case, the structure of an electric connection between the internal circuit within the main package body and the plurality of electronic components within the sub-package can be simplified, and the reliability of the electric connection can be further improved.

According to another preferred embodiment of the present invention, a package substrate includes a main package and a sub-package. The main package includes a main package body having first and second principal surfaces that are opposed to each other, a first bonding material provided on the second principal surface of the main package body, and an internal circuit provided within the main package body and electrically connected to the first bonding material. A recess is provided in the second principal surface so as to open downward, and the first bonding material is provided on the second principal surface and in a region around the recess. The sub-package is located in the recess of the main package and includes a plurality of electronic components embedded therein. The sub-package includes a sub-package body having first and second principal surfaces that are opposed to each other, a first pad conductor provided on the first principal surface of the sub-package body and electrically connected to the internal circuit of the main package and the electronic components within the sub-package body, and a second pad conductor provided on the second principal surface of the sub-package body and electrically connected to the electronic components within the sub-package. A thickness direction dimension that is a dimension from a bottom of the recess of the main package to a portion of the sub-package that is most distant from the recess, is equal or substantially equal to or less than a dimension from the bottom of the recess to a portion of the first bonding material that is most distant from the bottom of the main package.

In a package substrate according to another preferred embodiment of the present invention, a plurality of the first bonding materials are provided on the second principal surface of the main package body, and the sub-package is arranged so as to be surrounded by the plurality of first bonding materials. In this case, an extra region for accommodating the sub-package is not required in the second principal surface of the main package body. Thus, the size of the main package body can be further reduced.

In a package substrate according to another preferred embodiment of the present invention, the plurality of first bonding materials are provided on the second principal surface of the main package body and arranged along an outer periphery of the second principal surface of the main package body. In this case, the area of the second principal surface of the main package body can be further reduced.

In a package substrate according to another specific preferred embodiment of the present invention, the sub-package body is made of a synthetic resin. Thus, an independent electronic component can be easily embedded in the sub-package body, and the reliability of the structure where the electronic component is embedded can be improved.

In a package substrate according to various preferred embodiments of the present invention, the first bonding material is preferably made of a bump. In this case, the package substrate according to the preferred embodiments of the present invention can be easily mounted on a mounting portion, such as a printed circuit board, by a flip chip bonding method, for example.

In a package substrate according to various preferred embodiments of the present invention, the sub-package is provided on the second principal surface of the main package body, and the sub-package includes the electronic components embedded therein. In addition, the thickness direction dimension of the sub-package, or, when a recess is formed in the second principal surface of the main package, the dimension from the bottom of the recess to the portion of the sub-package that is most distant from the recess, is equal or substantially equal to or less than the thickness direction dimension of the first bonding material. Thus, the overall thickness does not become large. Therefore, the size and the thickness of the package substrate, in which the electronic components are incorporated, can be reduced.

Moreover, the electronic components are embedded in the sub-package, and are not embedded in the main package body. Thus, the reliability of an electric connection between the internal circuit, the first bonding material, and other components, which are provided in the main package body that is a main substrate material of the package substrate, is not decreased, and the reliability of the entire package substrate can be improved.

Other features, elements, characteristics and advantages of the present invention will become more apparent from the following detailed description of preferred embodiments of the present invention with reference to the attached drawings.

BRIEF DESCRIPTION OF THE DRAWINGS

FIGS. 17A and 17B are front cross-sectional views showing still another modified example of the independent electronic component used in the package substrate according to preferred embodiments of the present invention.

DETAILED DESCRIPTION OF THE PREFERRED EMBODIMENTS

Hereinafter, specific preferred embodiments of the invention will be described with reference to the accompanying drawings to clarify the invention.

Figure 1:
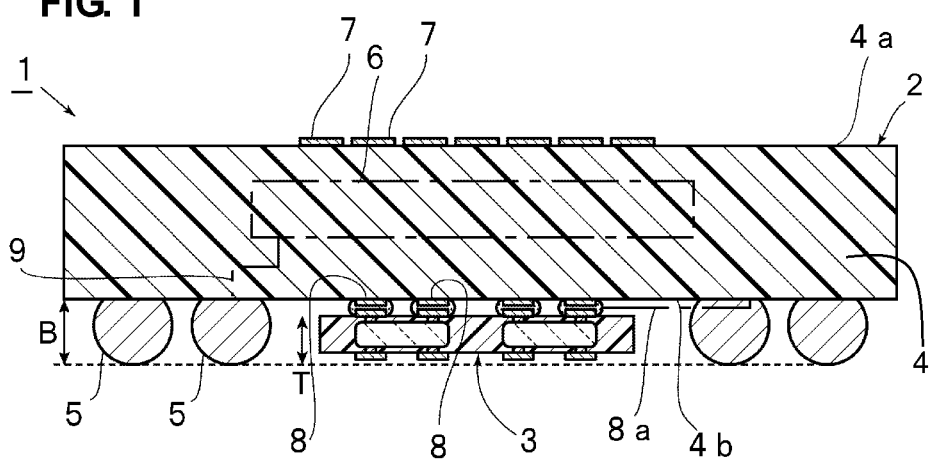
FIG. 1 is a front view of a package substrate according to a first preferred embodiment of the present invention.

FIG. 1 is a front view of a package substrate according to a first preferred embodiment of the present invention.

The package substrate 1 includes a main package 2 and a sub-package 3. Specifically, the main package 2 preferably has a substantially rectangular-parallelepiped-shaped main package body 4, for example. The main package body 4 includes a first principal surface 4a and a second principal surface 4b that are opposed to each other. On the second principal surface 4b, a plurality of first bonding materials 5 is provided.

Figure 2:
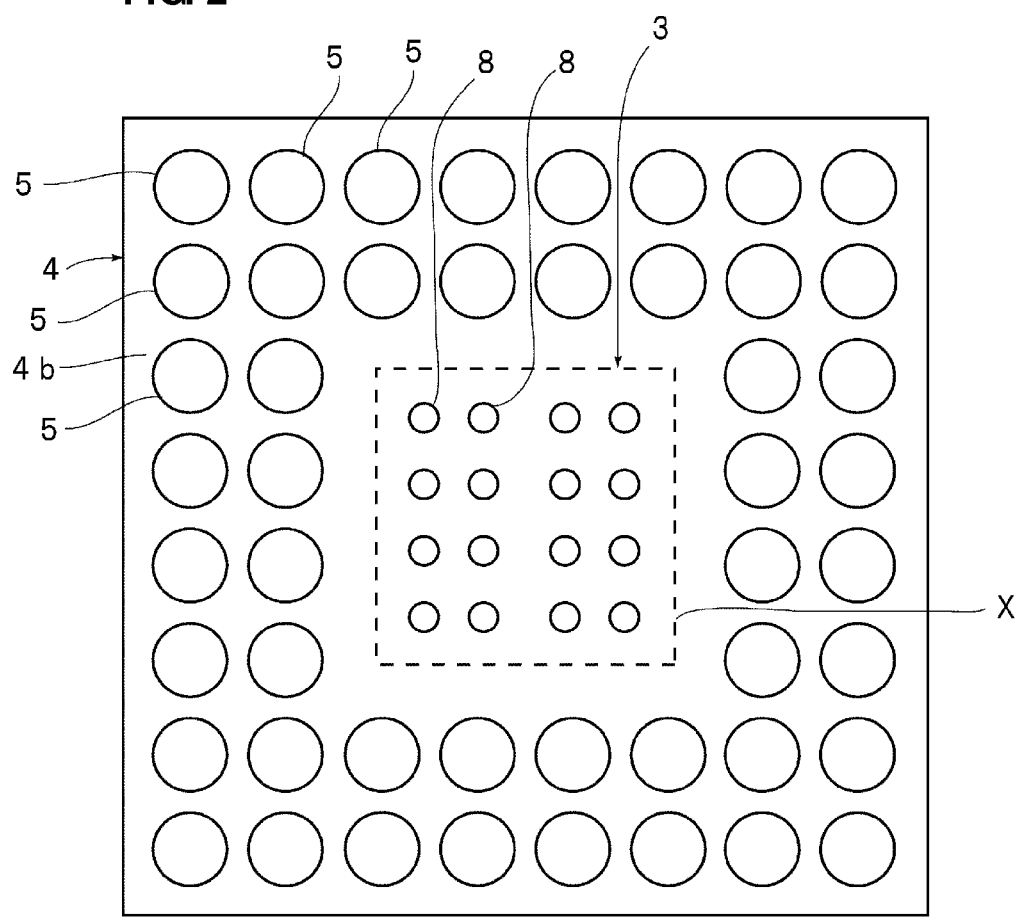
FIG. 2 is a bottom view of the package substrate of the first preferred embodiment of the present invention.

FIG. 2 is a bottom view of the package substrate 1. The plurality of first bonding materials 5 are provided on the second principal surface 4b of the main package body 4 so as to preferably be substantially in the shape of a rectangular frame, for example. The plurality of first bonding materials 5 are arranged along the outer periphery of the second principal surface 4b of the main package body 4. Then, the sub-package 3 is located in a region that is surrounded by the plurality of first bonding materials 5 and indicated by an alternate long and short dash line X. Thus, it is unnecessary to locate the sub-package 3 outside a region in which the plurality of first bonding materials 5 is provided. Therefore, the size of the main package body 4 can be reduced.

Further, a thickness direction dimension T of the sub-package 3 is preferably equal or substantially equal to or less than a thickness direction dimension B of each first bonding material 5. The thickness direction dimension T of the sub-package 3 and the thickness direction dimension B of each first bonding material 5 are dimensions from the second principal surface 4b of the main package body 4 to the lower edges thereof that are most distant from the second principal surface 4b.

Because the thickness direction dimension T is equal to or smaller than the thickness direction dimension B, even when the sub-package 3 is provided, the package substrate 1 does not increase in thickness as compared with the case where the sub-package 3 is not provided. Thus, the sub-package 3 is provided without increasing the thickness of the package substrate 1.

In the present preferred embodiment, the main package body 4 is preferably defined by a multilayer substrate in which a plurality of insulating layers are laminated. However, the main package body 4 is not necessarily defined a multilayer substrate, and may be defined by a single insulating material. The insulating material is not particularly limited, and a synthetic resin and an insulating ceramic can preferably be used, for example.

As the above synthetic resin, a thermosetting resin, such as an epoxy resin and a phenol resin, or a thermoplastic resin such as a thermoplastic polyimide, can preferably be used, for example. An inorganic filler, such as $Al_2O_3$ and glass, for example, may preferably be added to a synthetic resin.

Further, as the above insulating ceramic, an appropriate insulating ceramic, such as $Al_2O_3$, for example, is preferably used, and a $BaO-Al_2O_3SiO_2$ ceramic, for example, is more preferably used because it can be baked at a low temperature.

In the main package body 4, an independent electronic component is preferably not embedded. Examples of the independent electronic component include electronic components, such as a ceramic capacitor chip, that can be independently used as electronic components. Because an independent electronic component is not embedded in the main package body 4, problems caused when an independent electronic component is embedded in the insulating material are prevented. In other words, a decrease in reliability that is caused due to an undesirable gap between the electronic component and the insulating material around the electronic component, is unlikely to occur. In addition, a poor electric connection of the electronic component to a conductive path, such as a via-hole electrode, is unlikely to occur.

However, an internal circuit 6 is preferably provided within the main package body 4 as schematically shown by an alternate long and short dash line in FIG. 1. The internal circuit 6 does not include the above independent electronic component, and includes a conductor pattern provided in an interface between insulating layers of the multilayer substrate, a via-hole electrode that extends through the insulating layers, and other suitable elements. The internal circuit 6 may preferably be defined by the above conductive path, and a capacitor and an inductor may preferably be defined by a conductive layer and an insulating layer.

In the present preferred embodiment, because an independent electronic component is not embedded in the main package body 4, the thickness of the main package 4 can be much less than that of an existing package substrate in which a capacitor is embedded.

On the other hand, a plurality of first surface conductors 7 is formed on the first principal surface 4a of the main package body 4. A plurality of second surface conductors 8 is formed on the second principal surface 4b of the main package body 4. The first and second surface conductors 7 and 8 are formed of an appropriate conductor film. As such a conductor film, an appropriate metal film such as an Ag film and a Cu film can be used.

The thickness of each first surface conductor 7 is preferably from about 5 μm to about 50 μm, for example, and the thickness of each second surface conductor 8 is preferably from about 5 μm to about 20 μm, for example. If the thicknesses of the first and second surface conductors 7 and 8 are excessively large, the package substrate 1 cannot be thin, which causing an increase in cost. If the thicknesses of the first and second surface conductors 7 and 8 are excessively small, there is the possibility that reliability of an electric connection will be decreased.

The thickness of each second surface conductor 8 is preferably less than the thickness of each first surface conductor 7. Thinning of the second surface conductors 8 makes it possible to decrease the thickness direction dimension T of the sub-package 3, thereby increasing the design flexibility of the sub-package 3.

In the present preferred embodiment, the first bonding materials 5 are preferably made of solder bumps, for example. However, the first bonding materials 5 may be made of bumps made of another metal, such as gold, for example. Alternatively, the first bonding materials 5 may preferably be made of solder balls, for example. In either case, the thickness direction dimension B of each first bonding material 5 must be equal or substantially equal to or greater than the thickness direction dimension T of the sub-package 3. Thus, each first bonding material 5 preferably has a thick shape, such as a bump and a ball, for example. The thickness direction dimension B of each first bonding material 5 is preferably from about 0.2 mm to about 0.4 mm, for example.

Some of the first bonding materials 5 of the plurality of first bonding materials 5 are preferably electrically connected to the internal circuit 6 via a connection conductive path 9 as schematically shown. However, the plurality of first bonding materials 5 are not necessarily connected directly to the internal circuit 6 via the connection conductive path 9. The first bonding materials 5 may preferably be electrically connected to the internal circuit 6 via the second surface conductors 8.

It is noted that when the second surface conductor 8 includes an extension portion 8a as shown by an alternate long and short dash line in FIG. 1 and the first bonding material 5 is provided on the second surface conductor 8, a dimension including the thickness of the extension portion 8a, that is, the distance from the second principal surface 4b to the edge portion of the first bonding material 5 that is most distant from the second principal surface 4b, is defined as the thickness direction dimension B of the first bonding material 5.

As the materials of the conductive pattern and the via-hole conductor that define the internal circuit 6, an appropriate metal, such as Ag and Cu or an alloy thereof, for example, can preferably be used. Although not particularly limited, the thickness of the conductive pattern is preferably from about 10 μm to about 50 μm, and the diameter of the via-hole conductor is preferably from about 50 μm to about 200 μm, for example.

The main package body 4 can be obtained by a known build-up method, a technology of baking a ceramics-metal lamination, or other suitable method or technique. In the case of the build-up method, for example, a resin material and a metal foil may be sequentially laminated and the metal foil may be etched to form a surface conductor and an internal conductive pattern. Further, a via hole may be provided and filled with a metal plating material to form a via-hole conductor.

Figure 3:
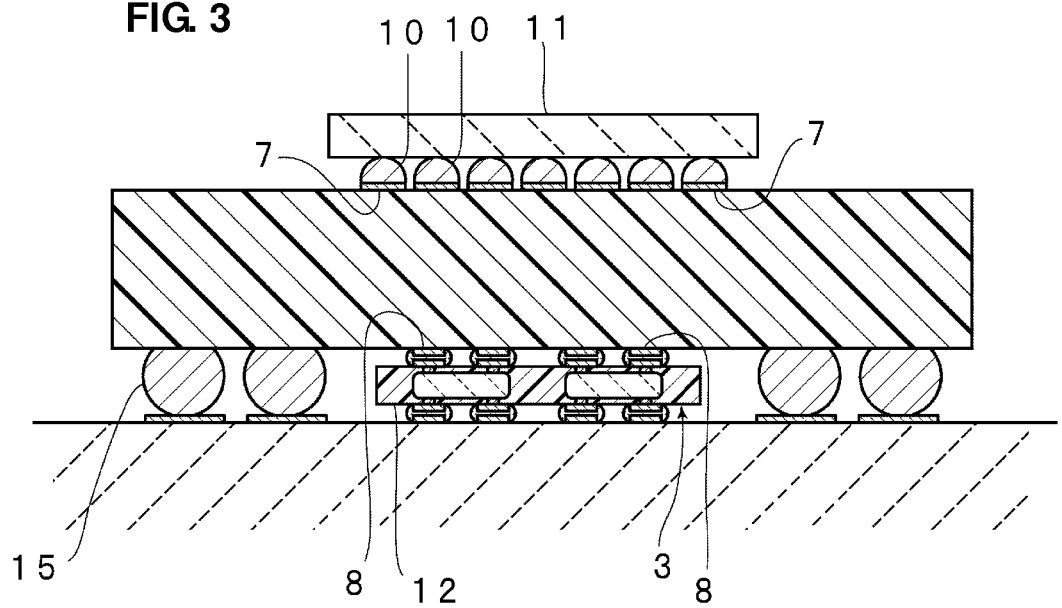
FIG. 3 is a schematic front view of the package substrate of the first preferred embodiment of the present invention, showing a state in which an IC is mounted on the package substrate.

Referring to FIG. 3, an IC 11 is mounted on the first surface conductors 7 via bumps 10. As the bumps 10, appropriate metal bumps, such as solder bumps and gold bumps, for example, can preferably be used. The package substrate 1 of the present preferred embodiment is a package material on which such an IC 11 is mounted, and includes the sub-package 3 on the lower surface side. Thus, a functional portion that is a circuit connected to the IC 11 and includes the internal circuit 6 and electronic components within the sub-package 3, can be provided without increasing the thickness and the area of the package substrate 1.

Figure 4:
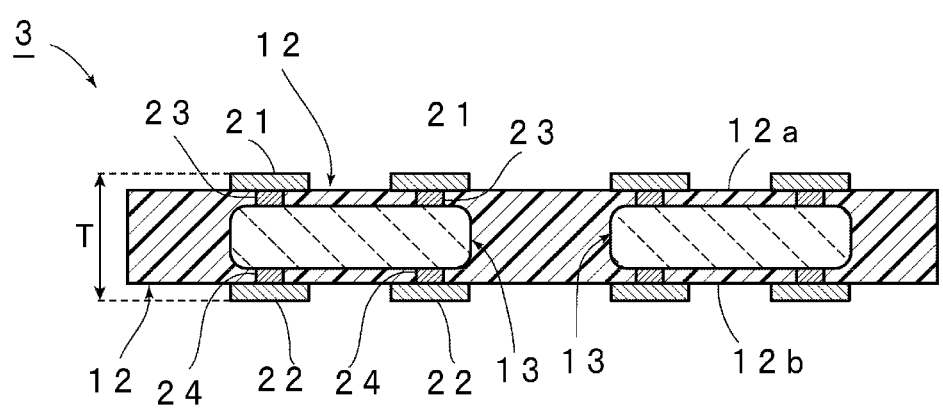
FIG. 4 is a front cross-sectional view of a sub-package used in the package substrate of the first preferred embodiment of the present invention.
Figure 5:
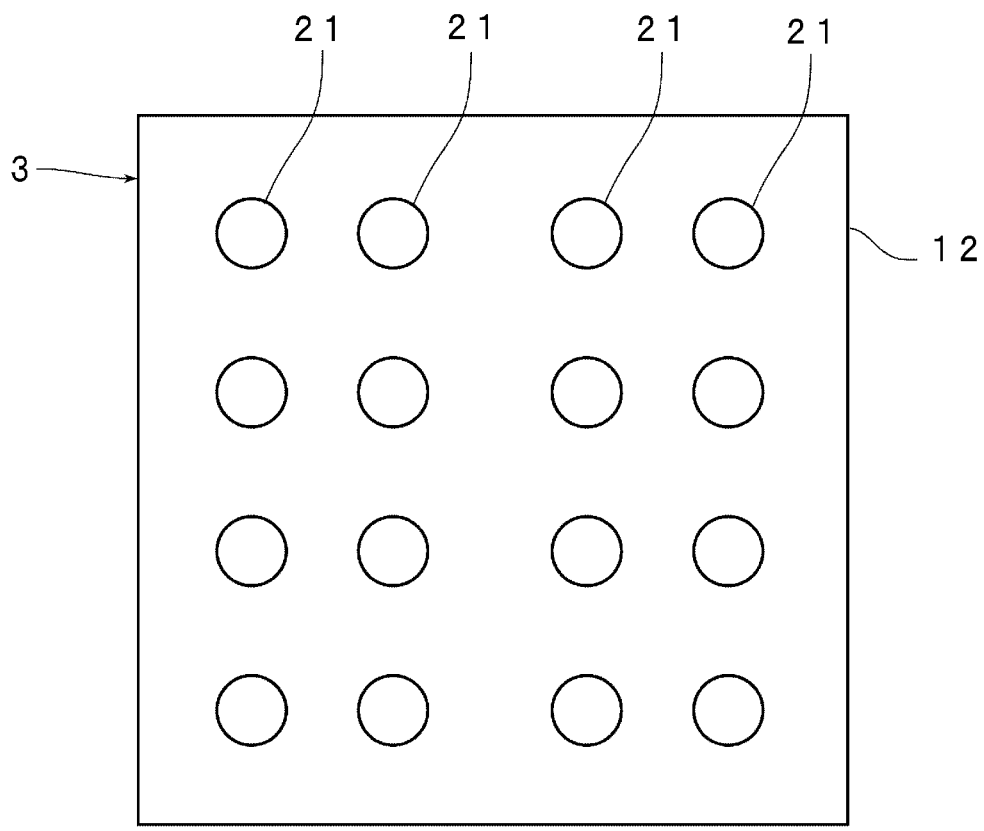
FIG. 5 is a plan view of the sub-package used in the first preferred embodiment of the present invention.

FIG. 4 is a front cross-sectional view of the sub-package 3, and FIG. 5 is a plan view of the sub-package 3. The sub-package 3 preferably includes a substantially rectangular-parallelepiped-shaped sub-package body 12. The sub-package body 12 includes first and second principal surfaces 12a and 12b that are opposed to each other. The thickness of the sub-package body 12 is equal or substantially equal to or less than the thickness direction dimension B of each first bonding material 5, and is preferably from about 0.2 mm to about 0.4 mm.

The sub-package body 12 is preferably made of an appropriate insulating material, for example. As such an insulating material, the same insulating material as used for forming the main package body 4 can preferably be used, for example.

The sub-package body 12 is preferably made of an insulating material having a thermal expansion coefficient substantially equal or substantially equal to that of the main package body 4, and is more preferably made of the same insulating material as used for forming the main package body 4. In this case, even when the temperature changes, the sub-package 3 is unlikely to detach from the main package body 4 because the difference in thermal expansion coefficient is small.

In the sub-package body 12, a plurality of independent electronic components 13 are preferably embedded. However, only one independent electronic component 13 may be embedded in the sub-package body 12.

Figure 6:
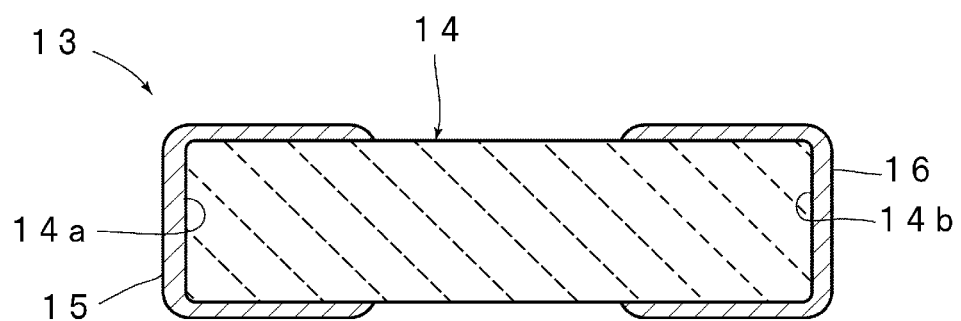
FIG. 6 is a front view of an electronic component embedded in the sub-package in the first preferred embodiment of the present invention.
Figure 7:
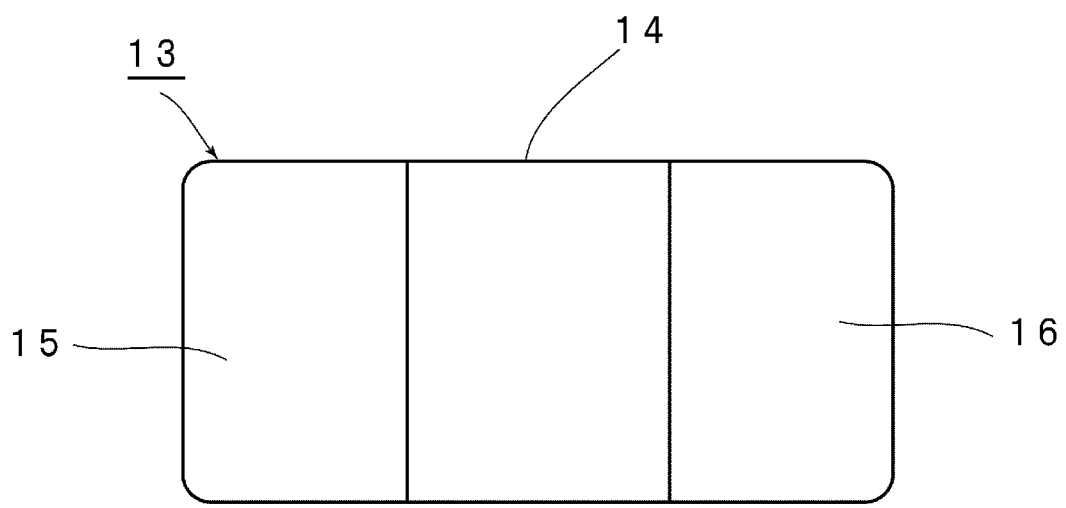
FIG. 7 is a plan view of the electronic component embedded in the sub-package in the first preferred embodiment of the present invention.
Figure 8:
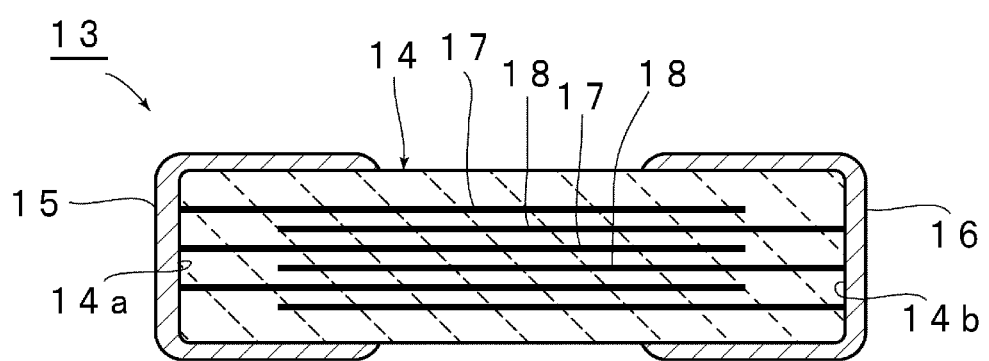
FIG. 8 is a front cross-sectional view of the electronic component embedded in the sub-package in the first preferred embodiment of the present invention.
Figure 9:
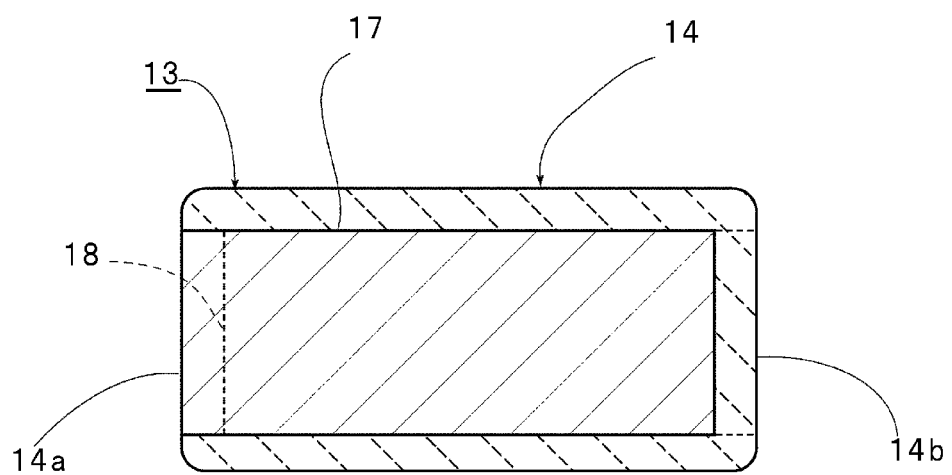
FIG. 9 is a schematic front cross-sectional view of the electronic component embedded in the sub-package in the first preferred embodiment of the present invention, showing a laminated structure of internal electrodes.

FIGS. 6 to 8 are a front view, a plan view, and a front cross-sectional view, respectively, of the electronic component 13. FIG. 9 is a schematic front cross-sectional view of the electronic component 13, showing an electrode structure within the electronic component 13.

The electronic components 13 used in the present preferred embodiment are preferably laminated ceramic capacitors. In other words, each of the electronic components 13 preferably has a substantially rectangular-parallelepiped-shaped ceramic sintered body 14, a first external electrode 15 provided to cover a first edge surface 14a of the ceramic sintered body 14, and a second external electrode 16 provided to cover the second edge surface 14b of the ceramic sintered body 14.

The ceramic sintered body 14 is preferably made of an appropriate dielectric ceramic, such as a barium titanate ceramic, for example.

In the ceramic sintered body 14, a plurality of first internal electrodes 17 and a plurality of second internal electrodes 18 are laminated via ceramic layers alternately in the thickness direction. The plurality of first internal electrodes 17 extend to the first edge surface 14a so as to be electrically connected to the first external electrode 15. The plurality of second internal electrodes 18 extend to the second edge surface 14b so as to be electrically connected to the second external electrode 16.

The internal electrodes 17 and 18 are preferably made of an appropriate metal material, such as Ag and an Ag—Pd alloy, for example. Further, the external electrodes 15 and 16 are preferably made of an appropriate metal, such as Ag or Cu or an alloy of Ag or Cu, for example.

In the present preferred embodiment, the plurality of electronic components 13 defined by the above laminated ceramic capacitors are embedded in the sub-package body 12. It is noted that the electronic components 13 are not limited to the above laminated ceramic capacitors, and may be independent electronic component chips that exhibit other electrical characteristics, such as a chip inductor and a chip resistor. Further, in addition to the ceramic, an electronic component defined by a chip made of a synthetic resin or another material may be used as each electronic component 13.

When the package substrate 1 includes a power supply circuit for the IC 11, an electronic component functioning as a decoupling capacitor is preferably used as each electronic component 13.

The thickness of each independent electronic component 13, that is, the thickness thereof along the thickness direction dimension of the sub-package body 12, is not particularly limited as long as it is less than the thickness direction dimension T.

On the first principal surface 12a of the sub-package body 12, a plurality of first pad conductors 21 are provided. On the second principal surface 12b of the sub-package body 12, a plurality of second pad conductors 22 are provided. The plurality of first pad conductors 21 and the plurality of second pad conductors 22 are electrically connected to the internal electronic components 13 via via-hole conductors 23 and 24, respectively.

It is noted that the via-hole conductors 23 and 24 are not necessarily provided. In other words, when the external electrodes of the electronic components 13 are exposed in the first principal surface 12a and the second principal surface 12b of the sub-package body 12, the first pad conductors 21 or the second pad conductors 22 may be electrically connected directly to the exposed external electrodes.

Figure 10:
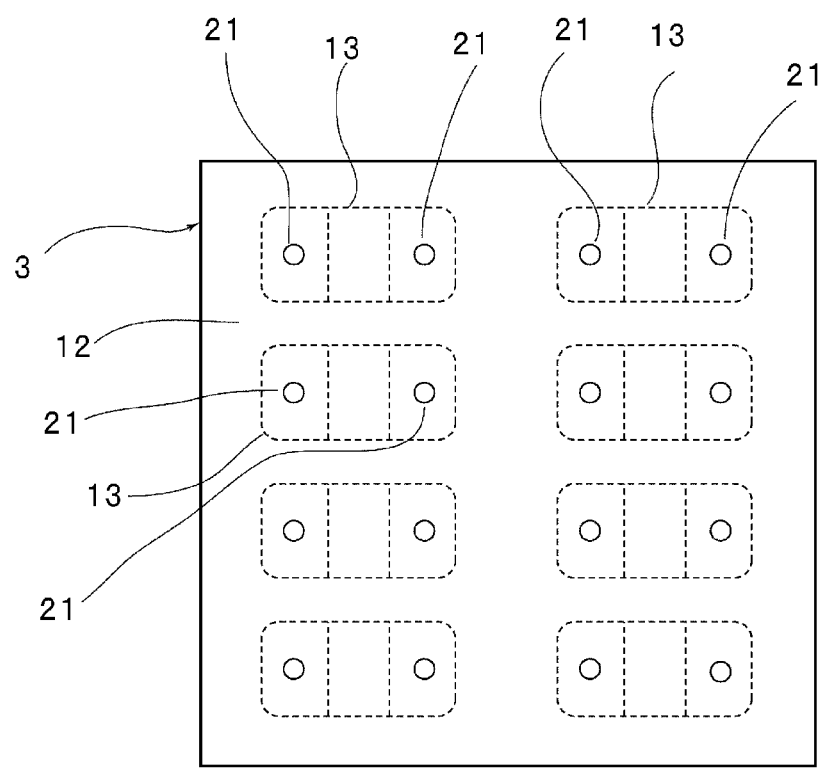
FIG. 10 is a schematic plan view of the sub-package used in the package substrate of the first preferred embodiment of the present invention.

Referring to FIG. 5, the plurality of first pad conductors 21 are arranged on the first principal surface 12a of the sub-package body 12 preferably in a matrix. Then, one electronic component 13 is located below and electrically connected to each pair of first pad conductors 21 as shown in a schematic plan view in FIG. 10. In other words, in the present preferred embodiment, many independent electronic components 13 are preferably arranged in a matrix within the sub-package 3.

Figure 11:
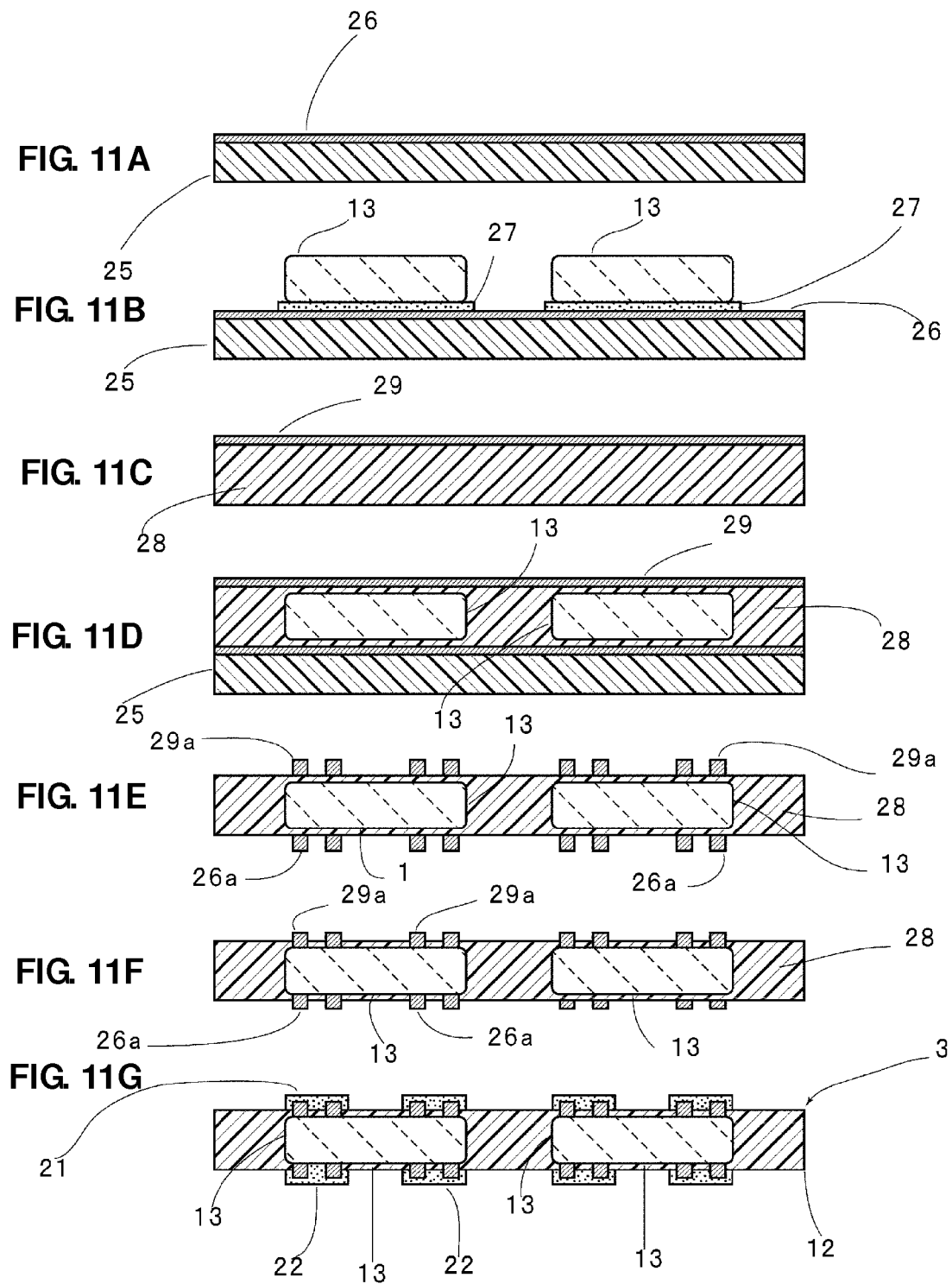
FIGS. 11A to 11G are schematic cross-sectional view illustrating one example of a method for manufacturing the sub-package used in the package substrate of the first preferred embodiment of the present invention.

The sub-package 3 can be manufactured by an appropriate method, such as a build-up method, for example. In one example, as shown in FIG. 11A, a metal foil 26 is laminated on a support 25 made of an appropriate insulating material. As shown in FIG. 11B, the electronic components 13 are bonded to the metal foil 26 via adhesive agents 27.

On the other hand, as shown in FIG. 11C, a prepreg sheet 28 is separately prepared. A metal foil 29 is laminated on and bonded to the prepreg sheet 28.

Thereafter, as shown in FIG. 11D, the prepreg sheet 28 is located above the support 25, and pressure welding is performed, whereby the electronic components 13 are embedded in the prepreg sheet 28. Thereafter, the prepreg sheet 28 is semi-cured, and the support 25 is removed in this state. Then, the metal foils 26 and 29 are patterned to form conductors 26a and 29a shown in FIG. 11E. As shown in FIG. 11F, the conductors 26a and 29a are pressed into the prepreg sheet 28 to create conductor portions that form the via-hole conductors 23 and 24. Electrode films are formed so as to be connected to portions of the conductor portions that project from the first and second principal surfaces 12a and 12b, thereby forming the first pad conductors 21 and the second pad conductors 22 (FIG. 11G).

It is noted that a method for forming the sub-package 3 is not limited to the above forming method and other suitable methods may be used to form the sub-package 3.

Referring back to FIG. 1, the sub-package 3 is mounted on the second principal surface 4b of the main package body 4. This mounting is performed using a conductive adhesive agent 35, by electrically connecting and bonding the first pad conductors 21 to the second surface conductors 8, respectively.

The first pad conductors 21 and the second pad conductors 22 may be omitted. In this case, it is only necessary to project the internal via-hole conductors 23 and 24 from the first and second principal surfaces 12a and 12b, respectively, of the sub-package body 12. In other words, the projecting portions of the via-hole conductors 23 and 24 may each function as a bump. In this case, the thickness of the sub-package 3 can be reduced.

As described above, in the package substrate 1 of the present preferred embodiment, the independent electronic components 13, which are used in a circuit portion that defines the power supply circuit for the IC 11, are embedded in the sub-package 3, and are not embedded in the main package body 4. Thus, the thickness of the main package body 4 can be reduced.

Moreover, the thickness direction dimension T of the sub-package 3 is equal or substantially equal to or less than the thickness direction dimension B of each first bonding material 5. Thus, the electronic components 13 can be incorporated without increasing the overall height of the package substrate 1.

Therefore, the thickness of the package substrate having the independent electronic components provided therein can be reduced.

Further, the sub-package 3 is mounted on the second principal surface 4b of the main package body 4. Thus, the independent electronic components 13 can be incorporated without increasing the area of the package substrate 1.

Figure 12:
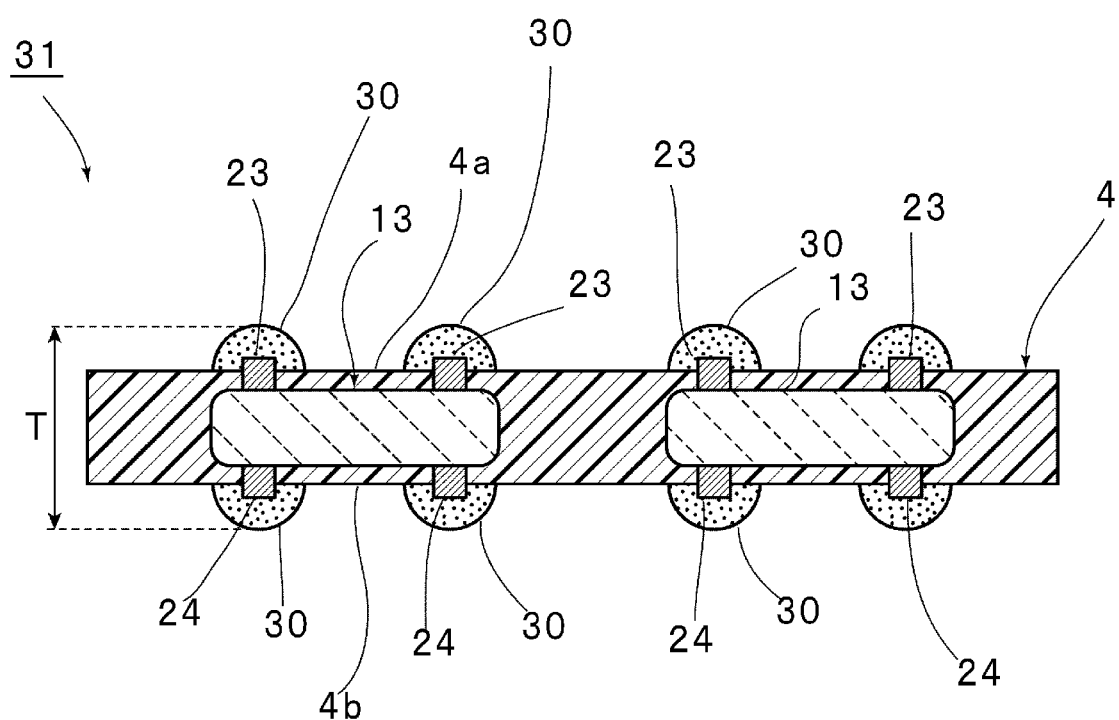
FIG. 12 is a front cross-sectional view of a sub-package used in a package substrate according to a second preferred embodiment of the present invention.

FIG. 12 is a schematic front cross-sectional view showing a structure of a sub-package used according to a second preferred embodiment of the present invention.

The second preferred embodiment is substantially the same as the first preferred embodiment, except that a sub-package is used instead of the above sub-package 3. In the sub-package 31, the plurality of independent electronic components 13 are embedded in the sub-package body 12. The via-hole conductors 23 and 24 are electrically connected to the electronic components 13 and project from the first principal surface 4a and the second principal surface 4b, respectively, of the sub-package body 12. Thus, the aforementioned first pad conductors 21 and second pad conductors 22 can be omitted.

In other words, the projecting portions of the via-hole conductors 23 and 24 also function as the first pad conductors 21 and the second pad conductors 22, respectively. A conductive adhesive agent 30 is applied so as to cover the projecting portions of the via-hole conductors 23 and 24. In this case, the thickness direction dimension T of the sub-package 31 is a thickness including the conductive adhesive agent 30.

Figure 13:
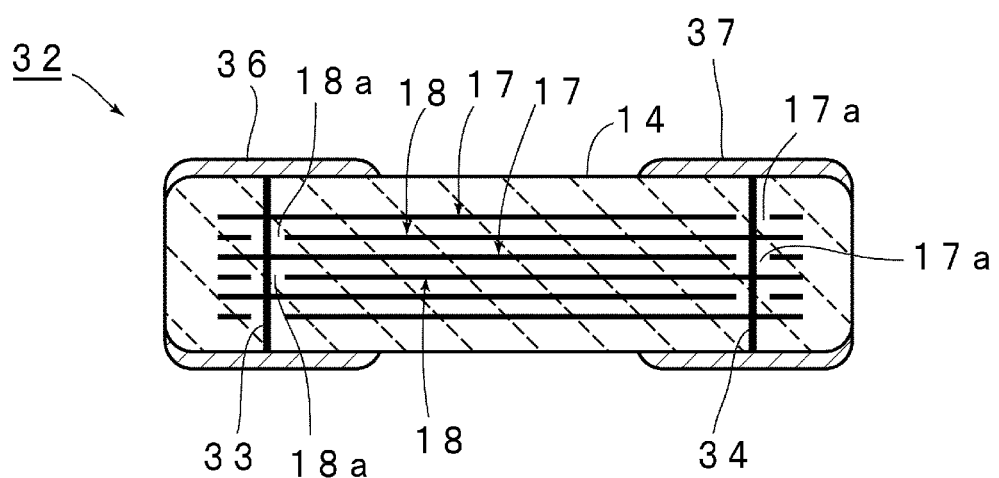
FIG. 13 is a front cross-sectional view of an independent electronic component used in a package substrate according to preferred embodiment of the present invention.

FIG. 13 is a front cross-sectional view of an electronic component 32 used in a package substrate according to preferred embodiments of the present invention. The electronic component 32 is a laminated ceramic capacitor, but includes first and second via-hole conductors 33 and 34. In other words, the plurality of first internal electrodes 17 are electrically connected to the first via-hole conductor 33, and the plurality of second internal electrodes 18 are electrically connected to the second via-hole conductor 34. Each of the first internal electrodes 17 includes an opening 17a that is not in contact with the second via-hole conductor 34 such that the first internal electrode 17 is not electrically connected to the second via-hole conductor 34. Similarly, each of the second internal electrodes includes an opening 18a, and is arranged so as not to be electrically connected to the first via-hole conductor 33.

In the electronic component 32, a first external electrode 36 is arranged so as to partially cover the upper surface, the lower surface, and the side surfaces of the ceramic sintered body 14, so that the first external electrode 36 is electrically connected to the upper end and the lower end of the first via-hole conductor 33. Similarly, a second external electrode 37 is arranged so as to extend on the ceramic sintered body 14 from the upper surface through the pair of side surfaces to the lower surface thereof, so that the second external electrode 37 is electrically connected to the second via-hole conductor 34.

In a structure having the first and second via-hole conductors 33 and 34 as in the electronic component 32, a current path can be shortened. Thus, when current does not flow though an electronic component, the electronic component 32 is preferably used instead of each electronic component 13.

Figure 14:
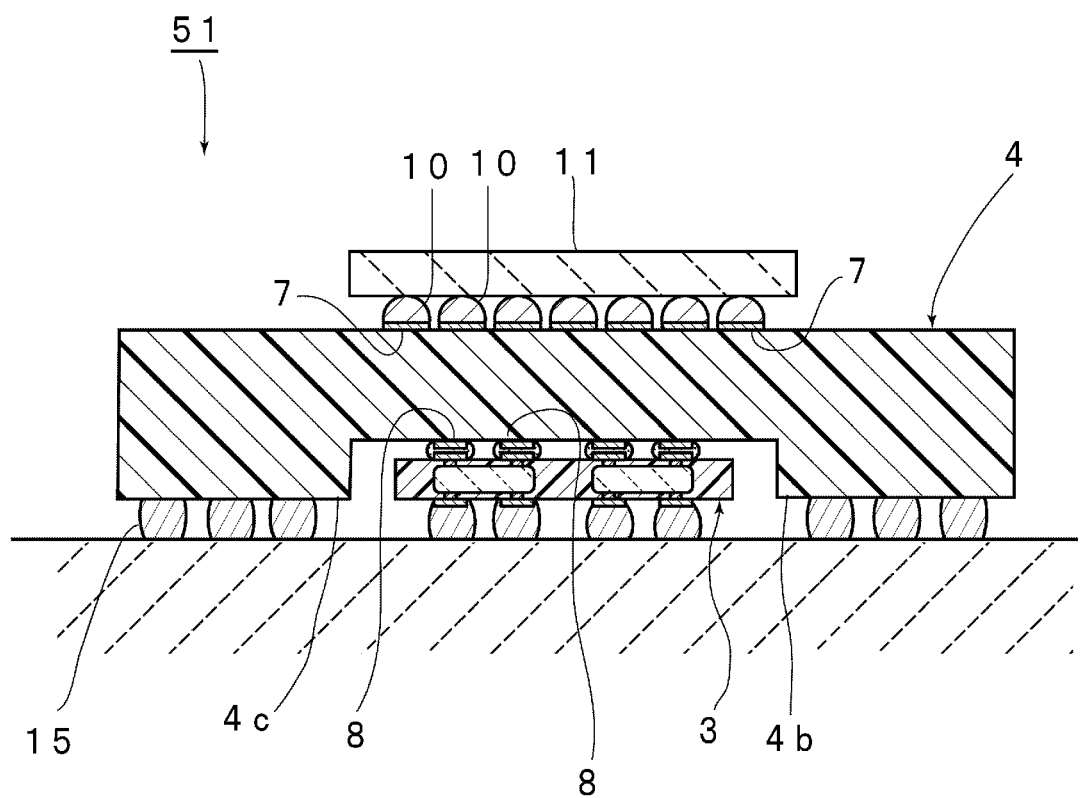
FIG. 14 is a front view of a package substrate according to a third preferred embodiment of the present invention.

FIG. 14 is a schematic front cross-sectional view of a package substrate according to a third preferred embodiment of the preferred invention.

The package substrate 51 of the third preferred embodiment is substantially the same as the package substrate 1 of the first preferred embodiment, except that a recess 4c is provided in the second principal surface 4b of the main package body 4 and the sub-package 3 is arranged in the recess 4c. Thus, the same portions are designated by the same reference numerals, and the detailed description thereof is omitted. Here, a portion of the sub-package 3 is located within the recess 4c, and the thickness direction dimension of the sub-package 3 that is a dimension from the bottom of the recess 4c to the portion of the sub-package 3 that is most distant from the bottom of the recess 4c is less than the sum of the depth of the recess 4c and the thickness direction dimension of the first bonding material 5. Thus, in the present preferred embodiment as well, the sub-package 3 is incorporated in the main package 2 without increasing the thickness direction dimension of the package substrate 51. Therefore, a decrease in thickness and an increase in density can be achieved in the package substrate 51.

It is noted that the depth of the recess 4c may be greater than the thickness direction dimension of the sub-package 3. In other words, the sub-package 3 may be entirely disposed within the recess 4c, and the lower surface of the sub-package 3 may be located above the second principal surface 4b.

Figure 15A:
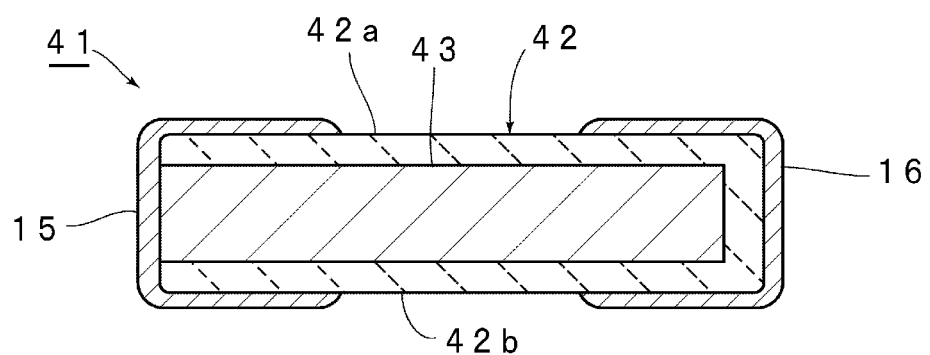
FIGS. 15A and 15B are front cross-sectional views showing another modified example of the independent electronic component used in the package substrate according to preferred embodiments of the present invention.
Figure 15B:
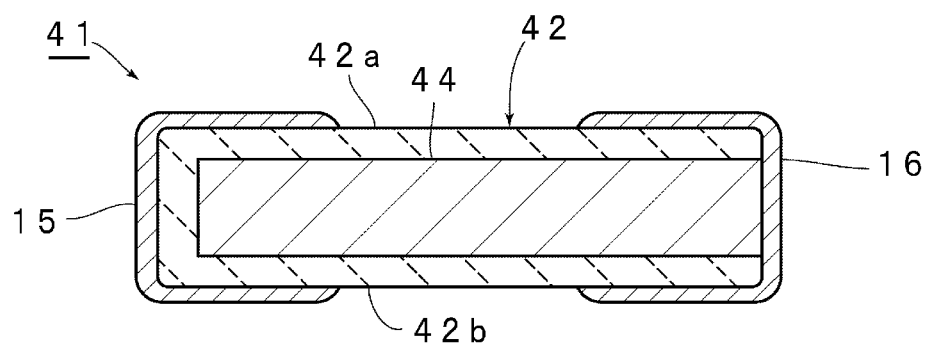

FIGS. 15A and 15B are schematic front cross-sectional views showing another example of the independent electronic component used in the package substrate according to preferred embodiments of the present invention. An electronic component 41 is a laminated ceramic capacitor. However, unlike the electronic components 13, a first internal electrode 43 and a second internal electrode 44 are arranged in an up-down direction connecting an upper surface 42a and a lower surface 42b of a ceramic sintered body 42. In other words, a plurality of first internal electrodes 43 and a plurality of second internal electrodes 44 are arranged in the vertical direction with respect to the mounting surface.

In this case, similar to the case of using the electronic component 32, the current path can be shortened. In addition, the width of the current path can be increased as compared to that in the case of using the electronic component 32. Thus, by using the electronic component 41, ESL (Equivalent Series Inductance) can be decreased.

Figure 16A:
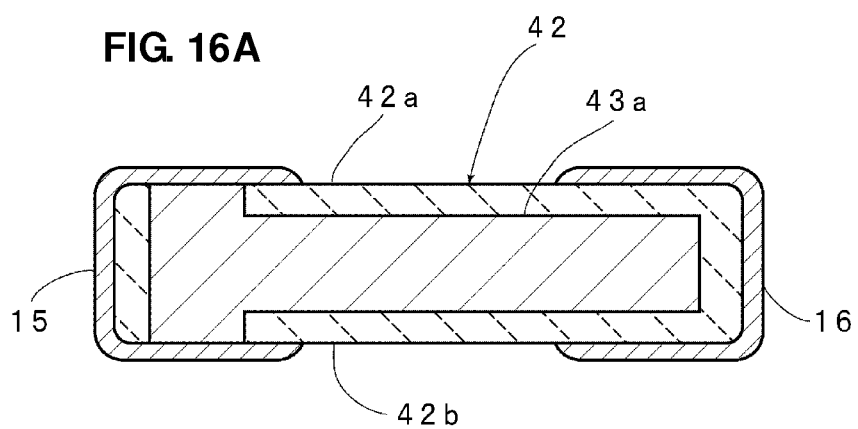
FIGS. 16A and 16B are front cross-sectional views showing another modified example of the independent electronic component used in the package substrate according to preferred embodiments of the present invention.
Figure 16B:
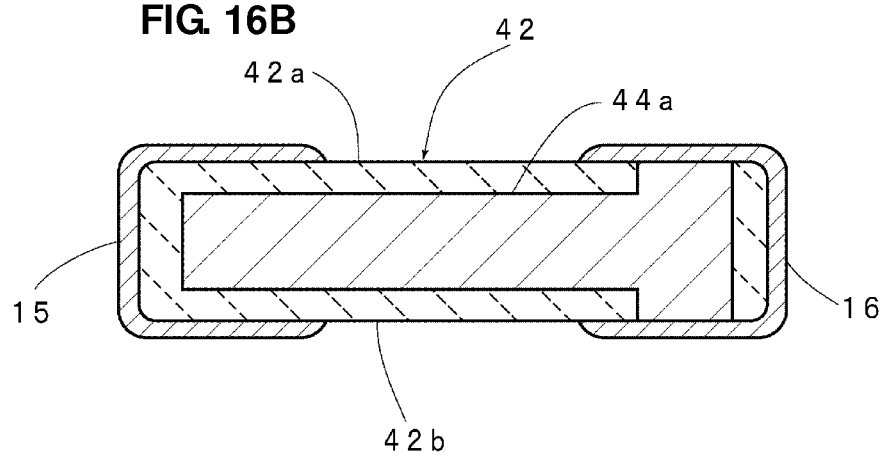
Figure 18:
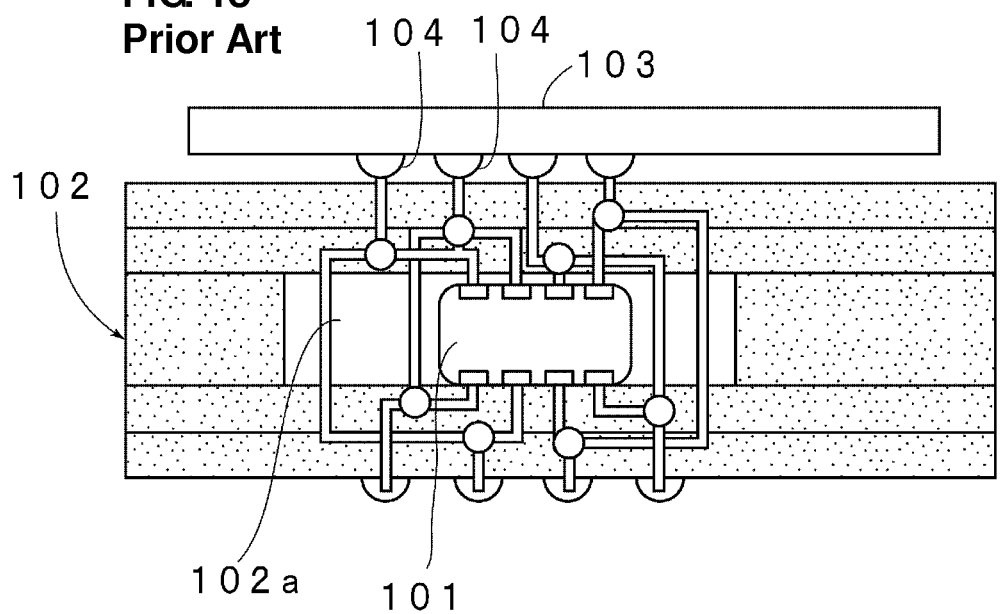
FIG. 18 is a front cross-sectional view of an existing package substrate.

Further, as shown in FIGS. 16A and 16B, a first internal electrode 43a and a second internal electrode 44a may be arranged such that only portions thereof electrically connected to the external electrodes have dimensions so as to connect the upper surface 42a to the lower surface 42b of the ceramic sintered body 42, and such that the other portions thereof have relatively-thin rectangular shapes so as not to extend to the upper surface 42a and the lower surface 42b.

Further, as shown in FIGS. 17A and 17B, first to fourth external electrodes 45a to 45d and fifth to eighth external electrode 45e to 45h may be provided on the upper surface 42a and the lower surface 42b, respectively, of the ceramic sintered body 42. In this case, a first internal electrode 43b may be extended to the first and third external electrodes 45a and 45c and the sixth and eighth external electrodes 45f and 45h, and a second internal electrode 44b may be extended to the other external electrodes, that is, to the second and fourth external electrodes 45b and 45d and the fifth and seventh external electrodes 45e and 45g.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A package substrate comprising:
a main package including:
a main package body including first and second principal surfaces that are opposed to each other;
a plurality of first bonding materials provided on the second principal surface of the main package body; and
an internal circuit provided within the main package body and electrically connected to at least one of the plurality of first bonding materials; and
a sub-package located on the second principal surface of the main package, the sub-package including:
a sub-package body made of an insulating material and including first and second principal surfaces that are opposed to each other; and
a plurality of independent ceramic electronic component chips embedded in the sub-package body; wherein
a thickness direction dimension that is a dimension from the second principal surface of the main package to a portion of the sub-package that is most distant from the second principal surface of the main package, is substantially equal to or less than a thickness direction dimension of the first bonding materials;
the first principal surface of the sub-package is arranged closer to the main package than the second principal surface of the sub-package body;
the plurality of independent ceramic electronic component chips embedded in the sub-package body are arranged in a direction parallel or substantially parallel to at least one of the first and second principal surfaces of the sub-package body;
the sub-package is surrounded by the plurality of first bonding materials;
the sub-package includes a pad conductor on the first principal surface of the sub-package; and
a dimension of the pad conductor is smaller than a dimension of each of the plurality of first bonding materials in a direction parallel to the second principal surface of the main package.

2. The package substrate according to claim 1, wherein another pad conductor is provided on the second principal surface of the sub-package body.

3. The package substrate according to claim 1, wherein the plurality of first bonding materials are arranged on the second principal surface of the main package body and in a position along an outer periphery of the second principal surface of the main package body.

4. The package substrate according to claim 1, wherein each of the plurality of the first bonding material is made of a bump.

5. The package substrate according to claim 1, wherein the main package includes a surface conductor on the second principal surface of the main package body, a dimension of the surface conductor is smaller than a dimension of each of the plurality of first bonding materials in the direction parallel to the second principal surface of the main package.

6. The package substrate according to claim 2, wherein the pad conductor and the another pad conductor are symmetrically arranged with respect to a plane.

7. The package substrate according to claim 6, wherein the another pad conductor is electrically connected to at least one of the plurality of independent ceramic electronic component chips.

* * * * *